United States Patent
Preusse et al.

(10) Patent No.: US 6,620,726 B1
(45) Date of Patent: Sep. 16, 2003

(54) METHOD OF FORMING METAL LINES HAVING IMPROVED UNIFORMITY ON A SUBSTRATE

(75) Inventors: Axel Preusse, Radebeul (DE); Markus Nopper, Dresden (DE); Gerd Marxsen, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/208,764

(22) Filed: Jul. 30, 2002

(30) Foreign Application Priority Data

Feb. 26, 2002 (DE) .......................................... 102 08 166

(51) Int. Cl.⁷ .......................................... H01L 21/4763
(52) U.S. Cl. ........................ 438/633; 438/678; 438/687; 438/692
(58) Field of Search .............................. 438/626, 629, 438/633, 678, 687, 692

(56) References Cited

U.S. PATENT DOCUMENTS

| | | | |
|---|---|---|---|
| 5,665,199 A * | 9/1997 | Sahota et al. ................. | 438/14 |
| 5,830,041 A * | 11/1998 | Takahashi et al. ............. | 451/8 |
| 5,928,960 A | 7/1999 | Greco et al. ................. | 438/692 |
| 5,972,192 A | 10/1999 | Dubin et al. ................. | 205/101 |
| 6,107,186 A | 8/2000 | Erb ........................... | 438/633 |
| 6,136,686 A * | 10/2000 | Gambino et al. ............... | 438/624 |
| 6,245,676 B1 | 6/2001 | Ueno .......................... | 438/687 |
| 6,302,765 B1 * | 10/2001 | Jacquinot et al. ............. | 451/41 |
| 6,319,834 B1 | 11/2001 | Erb et al. .................... | 438/687 |
| 6,344,408 B1 * | 2/2002 | Chen et al. ................... | 438/633 |

FOREIGN PATENT DOCUMENTS

| | | | |
|---|---|---|---|
| WO | WO 99/25004 | 5/1999 | ......... H01L/21/00 |
| WO | WO 02/47139 | 6/2002 | ......... H01L/21/288 |

* cited by examiner

*Primary Examiner*—T. N. Quach
(74) *Attorney, Agent, or Firm*—Williams, Morgan & Amerson, P.C.

(57) ABSTRACT

In a method of forming damascene metallization lines on a substrate by electroplating and chemical mechanical polishing, the metal layer thickness profile is shaped in correspondence to the removal rate during the chemical mechanical polishing. Thus, any non-uniformity of the chemical mechanical polishing process may be compensated for by appropriately depositing the metal layer so that erosion and dishing of the finally obtained metal lines are within tightly selected manufacturing tolerances.

57 Claims, 6 Drawing Sheets

METHOD OF FORMING METAL LINES HAVING IMPROVED UNIFORMITY ON A SUBSTRATE

BACKGROUND OF THE INVENTION

1. Field of the Invention

The present invention generally relates to the field of fabrication of integrated circuits, and, more particularly, to producing interconnect lines required in the various metallization layers of integrated circuits, such as CPUs, memory chips, and the like.

2. Description of the Related Art

In the fabrication of integrated circuits, such as CPUs, memory chips, application specific circuits and the like, it is generally necessary to provide one or more metal layers, so-called metallization layers, on the circuit substrate that serve to electrically connect the individual devices, such as transistor elements, capacitors, and the like, to one another. Depending on the complexity of the involved circuitry, the type of material used for the metallization and the dimensions of the metallization lines, which in turn are partly determined by the type of material and the available space on the substrate, a plurality of metallization layers may be necessary to provide the required functionality. The reproducible manufacturing of the individual metallization layers is of great importance for the performance and reliability of the integrated circuit, whereby the characteristics of each metallization line in every metallization layer must predictably lie within specified tolerances, as failure of a single line alone may jeopardize the complete circuit.

Since semiconductor manufacturers not only have to cope with requirements in terms of performance and reliability of the integrated circuits, but also in view of minimal production costs, the substrates on which the integrated circuits are fabricated are steadily increasing in diameter, since the majority of the process steps during manufacturing of the integrated circuit are carried out on a substrate basis rather than on a die basis so that a large number of chips may be processed in a single process step. Increasing substrate diameters, however, requires precise controlling of the process parameters to produce device features across the entire substrate that have characteristics as uniform as possible regardless of their location on the substrate.

Traditionally, aluminum has been used for metallization layers; however, semiconductor manufacturers have recently begun to employ copper as the metallization layer due to the superior characteristics of copper with respect to conductivity and electromigration, which are extremely important aspects for the production of integrated circuits with reduced feature sizes. One commonly used process for producing metallization layers is the so-called damascene process, where holes (also referred to as vias), trenches and/or other recessed portions are formed in an insulating layer, for example, a silicon dioxide layer, and are subsequently filled with the metal, such as copper. A preferred technique for supplying the copper to the vias and trenches is electroplating, since electroplating allows moderate deposition rates with a reasonable uniformity across large substrate areas compared to other deposition methods, thereby providing high cost-effectiveness. Electroplating requires, prior to deposition of the bulk material, the provision of a metallic seed layer, which is used to conduct electrical current during the bulk deposition. In some cases, the seed layer may also serve as a diffusion barrier layer and/or an adhesion layer for the bulk material, for example, copper,
filled in the vias and trenches. In general, the seed layer is a very thin layer of metal having a thickness of about 100 nm and may be deposited by any known method, such as physical vapor deposition (PVD) or chemical vapor deposition (CVD). After deposition of the seed layer, the substrate is brought into contact with a electrolyte bath containing ionic compounds including metal ions of the required type and a voltage is established between an anode within the electrolyte bath and the substrate which acts as a cathode, whereby the seed layer serves to distribute the current across the entire substrate area. The metal layer is plated to an extent to form an overlying layer, thereby providing a metal layer that fills the trenches and vias and extends slightly above these device features. Typically, the thickness of the metal layer is on the order of 1 $\mu$m.

After deposition of the metal layer, excess metal has to be removed to complete the patterning of metal lines. In the damascene process, chemical mechanical polishing (CMP) has proven to be the preferred technique for removing excess metal. During the chemical mechanical polishing, the combined action of a chemical removal agent and an abrasive is used to commonly react and grind and polish the exposed metal surface, thereby planarizing the residual substrate surface. Although CMP is very successfully employed in fabricating metallization layers, establishing a CMP technique that provides minimum non-uniformity across the entire substrate area has been found to be a challenging task for process engineers, especially for large-diameter substrates. In providing a uniform planarized surface after removal of excess metal, it is not only important during a CMP process to keep the removal of the metal and the surrounding dielectric material, which are also referred to as dishing and erosion, within specified tolerances regarding the various feature patterns on a single chip, but to maintain these specified tolerances in view of dishing and erosion also at locations that are spaced more distantly, for example at the center and the periphery of the substrate.

Figure 1A:
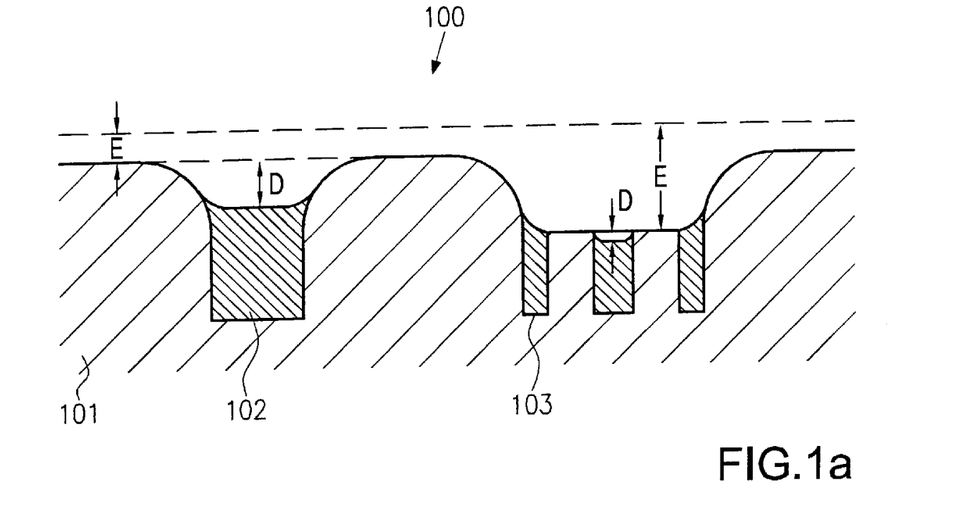
FIGS. 1*a* and 1*b* schematically show a cross-sectional view of a typical metallization structure at different positions on a substrate.
Figure 1B:
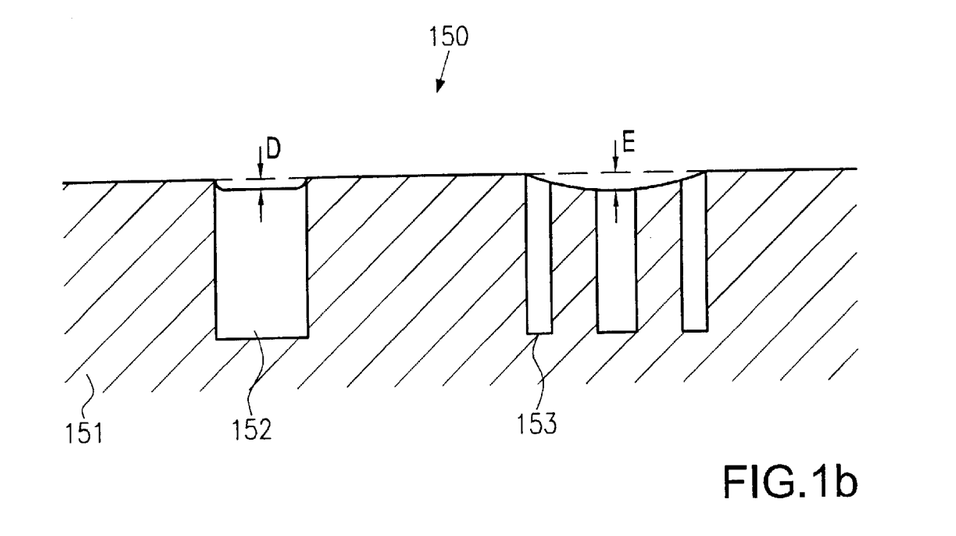

With reference to FIGS. 1a and 1b, a typical metallization pattern is schematically depicted to demonstrate the effects of dishing and erosion during CMP. In FIG. 1a, a metallization structure 100 comprises an insulating layer 101 having formed therein a single metal line 102 and a plurality of closely spaced metallization lines 103. The insulating layer 101 may, for example, be made of silicon dioxide and the metal lines 102 and 103 may primarily comprise copper. The metallization structure 100 may be positioned, for example, at a central location of the substrate. While the metallization structure 100 is subjected to the CMP process, insulating material is removed from the initial insulating layer 101 as represented by the arrows E. This removal of material compared to the initial material layer is referred to as erosion and may depend on the type of feature pattern formed in the insulating layer 101. For example, the erosion in the vicinity of the single metal line 102 may be significantly smaller than in the vicinity of the plurality of metal lines 103. Additionally, copper within the metal lines 102 and 103 is removed more intensely than material of the surrounding insulating layer 101. This excess material removal process within the metal lines 102 and 103 is referred to as "dishing" and is indicated by D in FIG. 1a.

FIG. 1b schematically depicts a metallization structure 150 comprising an insulating layer 151 and metal lines 152 and 153 formed in the insulating layer 151. In principle, the metallization structure 150 corresponds to the structure 100, but is, however, located at the periphery of the substrate. Since in the CMP process under consideration the removal rate at the periphery of the substrate is reduced compared to a central location, erosion and dishing in the metallization structure 150 is reduced compared to the structure 100. Accordingly, the metallization lines 152, 153 exhibit an increased cross-section and, therefore, an enhanced conductivity compared to the metal lines 102, 103. In order to secure reliability and performance of integrated circuits fabricated all over the substrate area, design rules must take into account the above-mentioned non-uniformities of the metal lines in different substrate areas. This contributes to process complexity and, thus, production costs.

In view of the above problems, there is a need for an improved process sequence for forming metallization layers exhibiting a higher degree of uniformity at different locations of the substrate.

SUMMARY OF THE INVENTION

The present invention is generally directed to a method that allows effective compensation for process variations during the formation of metallization layers by controlling the deposition of a metal layer in correspondence to process variations of the CMP process. Thus, a differing removal rate at a plurality of different areas on a substrate may be compensated for by controlling the deposition rate at each of the plurality of areas so as to correspondingly increase the layer thickness in an area having a high removal rate or to correspondingly decrease the layer thickness in an area having a reduced removal rate. In this way, even complex polishing variations, i.e., variations having a complex profile such as M-shaped or W-shaped profiles along the substrate diameter, may be corrected.

According to one embodiment, a method of forming metal lines comprises providing a substrate having formed therein a recessed portion in a first and a second region. The method further comprises obtaining an estimated expected removal rate of the metal at the first region and the second region of the substrate during a chemical mechanical polishing process to be performed. Additionally, the method includes depositing the metal on the substrate by electroplating, wherein a deposition thickness of the metal in the first and second regions is adjusted in correspondence to the estimated expected removal rate in the first and second regions. Moreover, excess metal is removed by chemical mechanical polishing to produce the metal lines.

In a further embodiment, a method of forming metal lines comprises providing a substrate with a central region and a peripheral region, wherein the central region and the peripheral region each have a recessed portion defining a height dimension. Moreover, a metal layer is deposited over the substrate, wherein an averaged layer thickness of the peripheral region is different from an averaged layer thickness of the central region. Additionally, the method includes removing excess material from the substrate by chemical mechanical polishing, wherein the difference of the averaged layer thickness of the peripheral and the central region is adjusted during the deposition of the metal such that the height of metal in the recessed portions is within a predefined tolerance after removal of the excess metal.

According to a another embodiment, a method of forming metal lines in a first and a second region of a substrate comprises the deposition of a seed layer on the substrate. Furthermore, the metal is deposited by electroplating while controlling at least one of an electrical field and electrolyte flow so as to be different at the first and second regions to obtain a greater metal thickness in one of the first and second regions that is expected to have a greater removal rate in a chemical mechanical polishing process to be performed. Moreover, the method includes the removal of excess metal in the first and second regions.

According to a further embodiment, a method of forming a metal line in a first and a second region of a substrate comprises depositing a seed layer on the substrate while controlling an averaged seed layer thickness in the first region to be different from an averaged seed layer thickness in the second region. Moreover, the method includes depositing the metal by electroplating to fill the metal lines and removing excess metal.

In another embodiment, a method of forming metal lines on a plurality of substrates comprises obtaining parameter values indicative of a quality of a chemical mechanical polishing process to be performed for each of the substrates. Moreover, the method includes relating the parameter values for each substrate to a corresponding metal layer thickness profile and depositing a metal layer on each substrate while controlling deposition parameters to substantially generate said metal thickness profile for each substrate. The method additionally comprises removing excess metal from each of the substrates by chemical mechanical polishing.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the under-standing of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As has been pointed out in the introductory part of the application, CMP and electro-plating are the preferred techniques for forming metallization layers, in particular for forming a copper metallization, wherein presently a great deal of effort is made to optimize the individual processes in view of uniformity across the entire substrate surface. The inventors of the present application recognized that the insufficiency inherent to the individual processes may advantageously be employed in combination so as to obtain an enhanced metallization structure as described herein.

Figure 2:
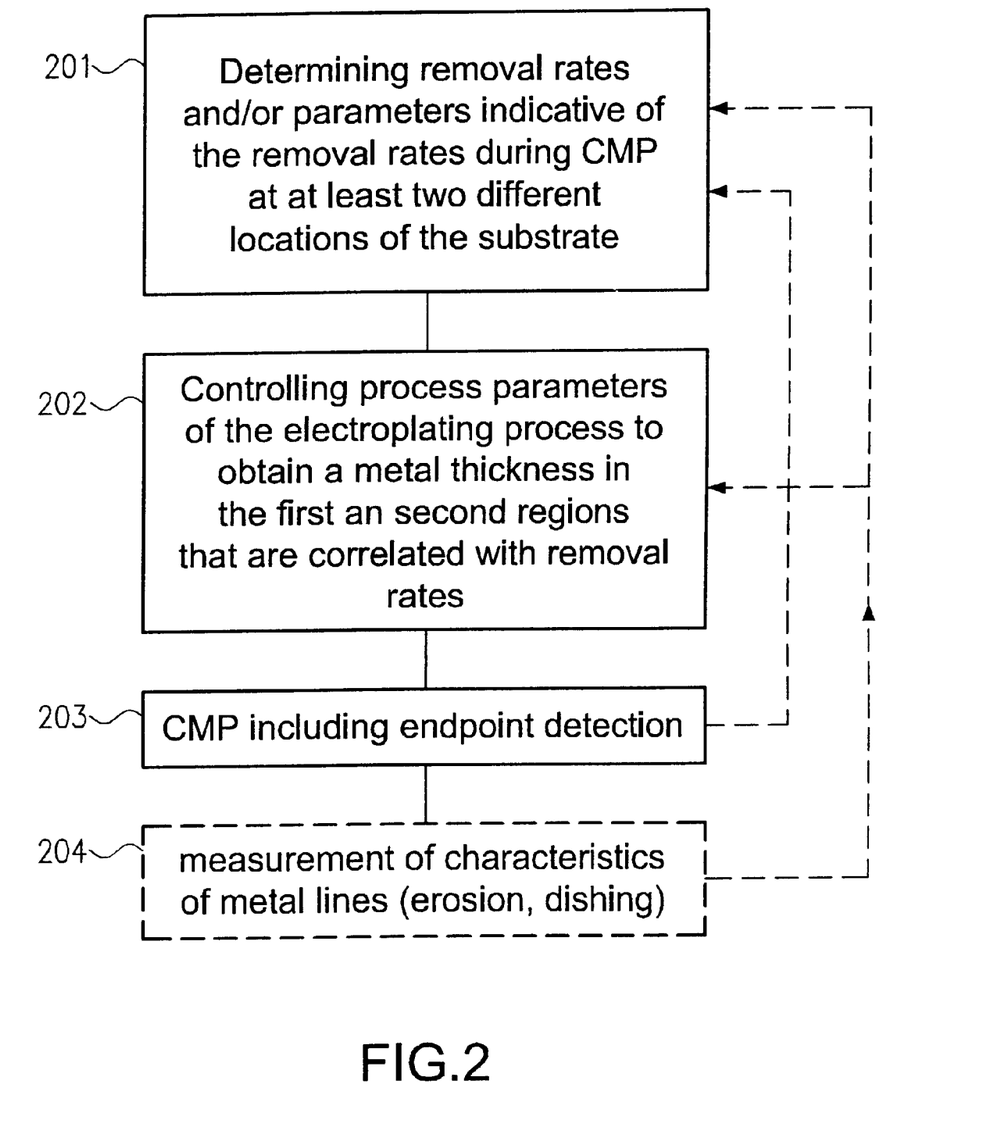
FIG. 2 is a diagram depicting a typical process flow of one embodiment of the present invention.

FIG. 2 depicts generally the process flow according to one illustrative embodiment of the present invention. In a first step 201 removal rates and/or parameters indicative of removal rates during a CMP process at at least two different regions on a substrate are determined. The determination of the removal rates and/or of the parameter values indicative of the removal rates may be attained by preparing corresponding test wafers that are subject to a CMP process as performed during the processing of product wafers.

According to one particular embodiment, the test wafers may bear trenches, vias and recessed portions that correspond to the device features of the product wafers. As is indicated in step 204, measurement of characteristics of metal lines, for example the erosion and dishing of selected lines, may be performed and the obtained results may be used for the determination of the removal rates and/or the parameter values indicating the removal rates. For instance, the erosion may represent a parameter that quantitatively describes the quality and thus removal rate uniformity of the CMP. According to this embodiment, also the product wafers or at least some of the product wafers may serve as the test wafers, thereby significantly reducing the number of test wafers or even rendering the employment of test wafers completely obsolete. Moreover, by determining the removal rates and/or the parameter values indicative thereof, such as erosion and/or dishing and/or the final layer thickness, on the basis of the measurement results of product wafers, the quality of the CMP process may continuously be monitored so that subtle changes in the CMP parameters due to, for example, degradation of the polishing pad, can be detected and taken into consideration for the determination of the corresponding removal rates and/or parameter values. For instance, any time dependence of the removal rates and/or of the parameter values can be taken into account after having established an initial removal rate and/or parameter value for the CMP station under consideration.

Furthermore, the determination of the removal rates and/or the parameter values indicative thereof can be carried out on the basis of a theoretical model of the CMP process. That is, calculations for erosion rates and dishing rates may be performed online or in advance, and the results thereof may be used for further processing. In one example, a series of test measurements is carried out and removal rates and/or corresponding parameter values may be obtained without further measurements once corresponding model data has been established from the empirical data.

According to step 202, a product substrate, such as a silicon wafer, bearing metallization structures at a first and a second region, such as the metallization structures 100 and 150 of FIGS. 1a and 1b (of course without metal), is subjected to electroplating, wherein process parameters of the electroplating process are controlled so as to obtain a metal thickness in the first and the second region that is correlated with the removal rates and/or the parameter values determined in step 201. For instance, as previously explained, the removal rate of copper in a typical copper metallization process may be higher in the central region of the substrate than in the periphery. Accordingly, the process parameters of the electroplating process are controlled so as to obtain an increased metal thickness in the central region such that the actual removal rates in the central region and the peripheral region are within specified tolerances when the removal rates and/or the parameter values determined in step 201 are used as a basis. In particular, erosion and dishing values may be used for evaluating the removal rates, or may directly be used as the control parameters.

Figure 3A:
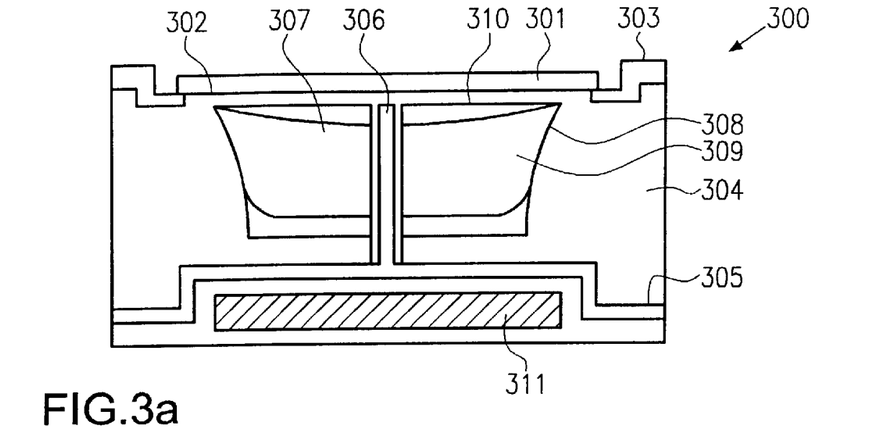
FIG. 3*a* schematically depicts an exemplary reactor for electroplating to form a metal layer having a desired profile in accordance with one embodiment.

The controlling of the deposition thickness in the first and second regions, i.e., the controlling of the process parameters of the electroplating process, will now be described with reference to FIGS. 3 and 4. FIG. 3a schematically depicts an electroplating reactor 300 for depositing a metal layer on a substrate 301. The substrate 301 comprises a working surface 302 on which the metal, for example copper, is to be deposited. The substrate 301 is supported by a substrate holder 303 that is also configured to provide an electrical connection to a voltage source not shown in FIG. 3. The reactor 300 further comprises a reactor cavity 304 containing an electrolyte with metal ions that are to be deposited on the working surface 302. The electrolyte may be introduced into the reactor cavity 304 by a fluid line 305 that is also connected to a vertical riser pipe 306 arranged to supply electrolyte to the central portion of the substrate surface 302. A fluid distribution means 307 is located within the reactor cavity 304 and comprises two or more blades or vanes 308, which in turn may comprise a fluid passage 309 and a shield 310. The fluid distribution means 307 is rotatable around the central riser pipe 306 by appropriate driving means not shown in the figure. A large area anode 311 is arranged at the bottom of the reactor cavity 304 and is in contact with the electrolyte.

In operation, the fluid distribution means 307 rotates and electrolyte is supplied to the working surface 302, which now serves as a cathode, so that metal deposits on the working surface 302. The fluid distribution means 307 may be rotated by any appropriate drive system, such as an electrical motor, by coupling to a rotating magnetic field, and the like. Since the electric field prevailing at the surface 302 significantly depends on the shape of the shields 310 due to the ion transportation path determined by the shield 310, the deposition rate at specific regions on the substrate surface 302 is influenced by the shape of the shields 310. Accordingly, by appropriately selecting the shape of the shields 310, the thickness profile of the finally obtained metal layer can be adjusted. For instance, the shape of the shields 310 may be selected to obtain a "dome-like" thickness profile wherein the working surface 302 takes on an increased averaged metal thickness in the central region. Alternatively, and depending on the subsequent CMP process, a thickness profile may be attained in which the central region has a decreased metal thickness. Alternatively or additionally, in one embodiment, the flow of electrolyte to the working surface 302 may be controlled so as to obtain the desired thickness profile. In this respect, the shields 310 or additional shields may be arranged so as to restrict the fluid flow of electrolyte in substrate regions where a decreased metal thickness is desired. For example, additional shields may be provided at the periphery of the substrate 301 to restrict fluid flow in these regions. The shields 310 and the additional shields may be made of a non-conductive, preferably inert, material, such as Teflon®, so as to not react with the electrolyte. Moreover, by influencing the fluid flow, the electrical field is also affected in these regions.

Figure 3B:
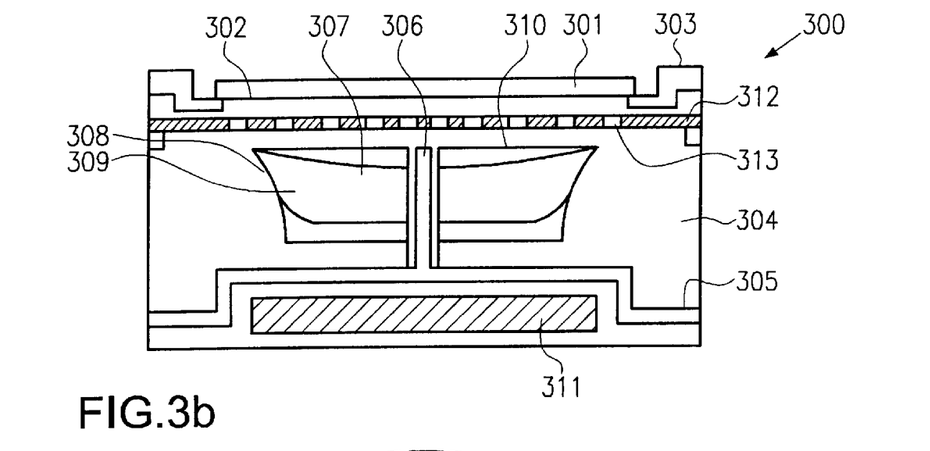
FIG. 3*b* schematically depicts an embodiment using a diffusing element to obtain a desired metal profile.

FIG. 3b schematically depicts a further embodiment similar to the embodiment illustrated in FIG. 3a, wherein like parts have like numerals. Between the fluid distribution means 307 and the substrate 301 a diffusing element 312 is provided, having formed therein a pattern of openings 313 that shapes the electric field and/or controls the fluid flow to respective regions on the substrate 301 to thereby control the deposition rate and thus the finally obtained thickness profile. In FIG. 3b, the pattern 313 is constituted by substantially equally-sized openings that are provided in the central region more densely than at the periphery. However, the illustrated pattern 313 is only of exemplary nature and any appropriate shape and number of openings may be arranged to obtain the required flow distribution. For example, the openings can be arranged more densely in the periphery when a higher deposition rate is required in this region. Moreover, the material of the diffusing element 312 may be conductive so that the electrical field influencing the paths of the ions within the fluid flow may also be controlled.

Figure 3C:
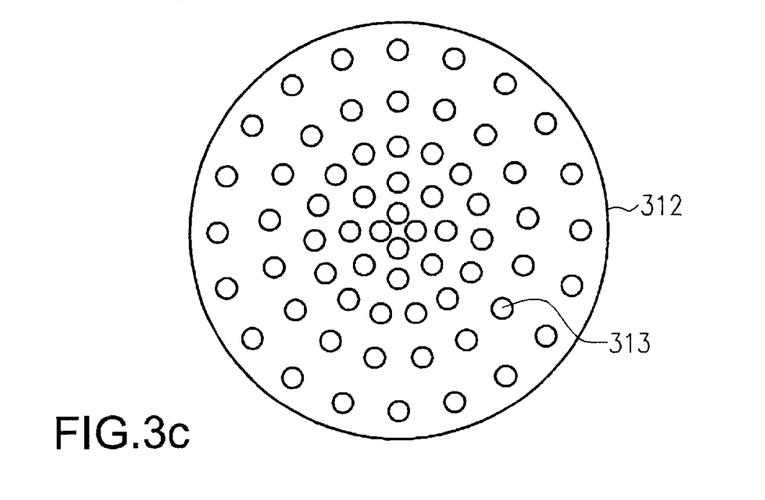
FIG. 3*c* shows a plan view of the diffusing element of FIG. 3*b*.

FIG. 3c depicts the diffusing element 312 in more detail. As can be seen, the openings 313 form a pattern that allows an increased fluid flow to the central region of the substrate 301.

In a further embodiment, the anode 311 may be made of a plurality of distinct anode elements, which are arranged to provide a required electric field distribution for obtaining the desired thickness profile. In one embodiment, anode elements of substantially equal size are provided below the substrate, wherein in a region corresponding to the central region of the substrate significantly more anode elements are arranged than in a region corresponding to the periphery of the substrate. Therefore, a higher current density and thus deposition rate may be attained in the central region of the substrate.

It should be noted that the above-explained methods of attaining the desired thickness profile may also be used in combination. Moreover, in the art of electroplating, great efforts are made to obtain a uniform metal layer, whereby a variety of parameters influencing the finally obtained profile of the metal layer have been investigated. The corresponding results may thus be employed to adjust the corresponding parameters to "deform" the metal layer for obtaining a thickness profile required to compensate for the varying removal rates during a CMP process.

Figure 4:
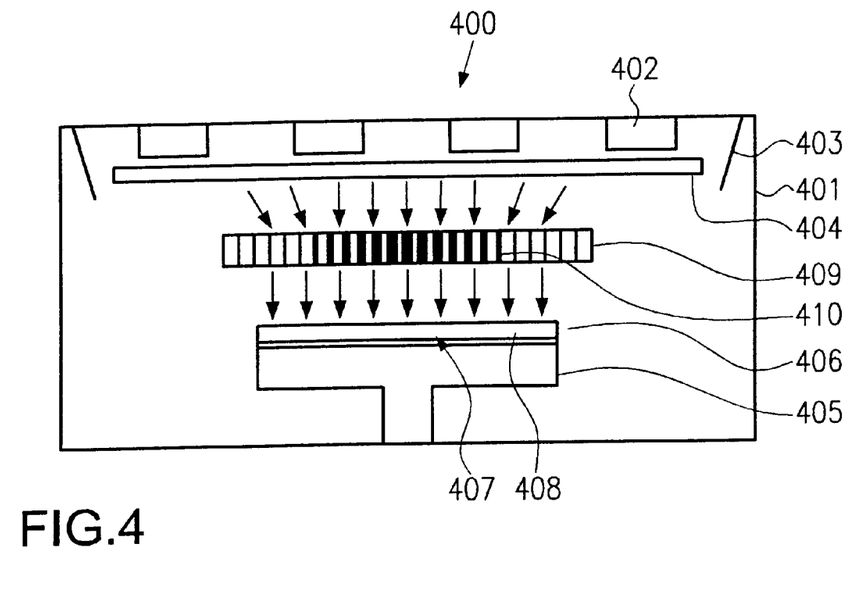
FIG. 4 schematically depicts a process chamber of a sputter tool to produce a seed layer having a desired thickness profile in accordance with a further embodiment.

With reference to FIG. 4, a further embodiment is described in which process parameters for depositing a metal layer on a substrate are controlled so as to obtain a required thickness profile. In FIG. 4, a sputter tool 400 comprises a reaction chamber 401 including a plurality of magnets 402, a plasma shield 403 and a sputter target 404. On a substrate stage 405, a substrate 406 is provided including a first substrate region 407 and a second substrate region 408. A collimator 409 is located between the sputter target 404 and the substrate stage 405. The collimator 409 comprises openings 410, the diameters of which vary along the radius of the collimator 409, such that the openings 410 corresponding to the first region 407 have a larger diameter than the openings 410 corresponding to the second region 408. For the sake of convenience, in FIG. 4, any other means required for the operation of the sputter tool 400, such as feeding lines, plasma excitation means, radio frequency generator, bias voltage supply source and the like, are omitted.

As previously explained, in depositing a metal layer by electroplating, a thin seed layer is required that serves as a current distribution layer. As is well known, the deposition rate during electroplating depends, among other things, on the current density at the respective location of the substrate. Thus, if the initial capability for current transportation of the seed layer is designed to have a required profile, the initial deposition rate during electroplating, and thus the deposition rate during approximately the whole deposition process, may be increased or decreased as required. In particular, the initially decreased deposition rate in the center region of the substrate that is caused by the increased electrical resistance can be positively compensated for by the sputter tool shown in FIG. 4.

In operation, target atoms are liberated from the sputter target 404 by incoming charged particles of the plasma (not shown) and move towards the collimator 409. Due to the profile of the openings 410, a larger amount of target atoms hits the substrate 406 in the first region 407 than it does in the second region 408. The finally obtained thickness profile of the seed layer essentially conforms to the profile of the openings 410. In the present embodiment, the thickness profile of the seed layer will entail the dome-like thickness profile of the final metal layer obtained by the subsequent electroplating. According to this embodiment, conventional electroplating reactors may be used since no further control of process parameters, except for conventional process control for forming a uniform metal layer, during electroplating is necessary. In further embodiments, however, additional process parameters of the electroplating may be controlled in the manner as pointed out above with reference to FIG. 3.

In a further embodiment, the thickness profile of the seed layer may be controlled by varying the plasma shape, for example, by introducing correspondingly shaped plasma shields and/or by influencing the deposition rate by controlling the temperature of the substrate 406. It should be noted that the process parameters of other deposition methods for forming the seed layer may be controlled so as to obtain the required thickness profile. For instance, in one embodiment, chemical vapor deposition may be employed, wherein an appropriately formed deposition mask is provided that effectively varies the deposition rate on the substrate. Moreover, the temperature of the substrate may be controlled to modify the deposition rate.

Again referring to FIG. 2, after depositing the metal layer, the substrate is subjected to the CMP process, in which an endpoint detection is carried out to determine clearance of the wafer surface. In a particular embodiment, endpoint detection is performed in the first and the second regions and the measurement results are used for the determination of the removal rates and/or the parameter values indicative for the removal rates. For instance, the time difference between the occurrence of the clearance in the first and second regions may be used as a measure of the difference in removal rates of these regions and a corresponding correction value for the deposition of the metal layer in a subsequent substrate may be obtained. This procedure is advantageous when electroplating and CMP take place substantially at the same time so that any corrections required in shaping the profile of the metal layer may immediately be transmitted to the electroplating station to correspondingly change the deposition rate. In most cases, however, electroplating takes place for a lot of substrates prior to the lot being subjected to the CMP process, and any deviations in the removal rates and/or the parameter values indicative thereof may be gathered on, for example, lot basis and employed for the deposition process of subsequently plated substrate lots. A systematic parameter drift during the CMP process can therefore be detected and taken into account on a lot basis.

In one embodiment, a "forward" correction of "actual" CMP variations may be carried out, even if the metal deposition is completed. To this end, a model of the CMP may produce simulation results for an initially profiled substrate and "predict" results during the "progress" of the (simulated) CMP. The modeled CMP may be represented by erosion values, dishing values, layer thickness and the like.

The calculations may be performed on a (model) wafer basis and the simulation results may immediately be entered into the process control of the actual electroplating process. For instance, if in general a "dome-like" profile is required, the maximum dome height can be finely tuned individually on the basis of simulation results obtained from the CMP model for this substrate. To further enhance accuracy of this process, actual measurement results obtained on a lot basis of the actual CMP may be fed back to the CMP model to compensate for slight discrepancies between the model and the actual process.

After the CMP is completed, according to step 204, measurement of characteristics of the metal lines may be performed so as to determine, for example, erosion and dishing in the first and second regions. The corresponding measurement results may also be used to determine the removal rates and/or any parameter values. In one particular embodiment, these measurement results are employed for establishing a model, for example in the form of tables containing erosion and/or dishing values to process parameter values related to controlling the electroplating process. Thus, the determination of removal rates and/or any parameters indicative thereof may be accomplished for a plurality of substrates once initial removal rates at the beginning of a new process cycle have been established. For instance, an initial lot of substrates is processed in accordance with the sequence of FIG. 2, wherein initially removal rates have been determined in advance to control the deposition and thus the thickness profiles during electroplating. In step 204, erosion and dishing values are obtained and immediately fed back to the electroplating station to take into consideration any corrections necessary for obtaining the required tolerances. In this way, a sort of closed feedback loop is established in which possible changes in the electroplating and the CMP process may be compensated.

With reference to FIGS. 5a–5e, a further illustrative embodiment will now be described. A plurality of substrates in wafer form having a diameter of about 300 mm have been prepared such that each of the wafers comprises a plurality of vias and trenches formed in an insulating layer, for example in the manner as shown in FIG. 1. In each wafer, a central region located at the center of the wafer and extending over at least several milli-meters and a peripheral region located at the perimeter of the wafer and extending inwardly at least about several millimeters comprise at least one metal line that may be used for measurements to determine removal rates and/or other parameters indicative of the removal rates, such as erosion and/or dishing. A first wafer receives a copper metal layer of about 1 $\mu$m thickness in accordance with standard process parameters, i.e., the electroplating parameters are adjusted to obtain a copper surface as uniform as possible. A second wafer is prepared with a profiled copper layer, wherein the wafer comprises a dome-like profile with a maximum thickness at the middle of the central region that exceeds the metal thickness at the perimeter by about 50 nm. A third wafer has been prepared with a thickness in the middle of the central region exceeding the perimeter by about 80 nm, and a fourth and a fifth wafer are prepared in the same manner having an excess thickness of 100 nm and 150 nm, respectively. The first to fifth wafers are then subjected to a CMP process under similar conditions, wherein the end of the CMP step is determined by endpoint detection in the peripheral and central regions. In subsequent measurements, the erosion of the at least one metal line in each of the central and peripheral regions of the first to fifth wafers have been determined at seven positions separated radially. In FIGS. 5a–5e, the erosion in the central regions is indicated by circles and the erosion in the peripheral regions is indicated by squares.

Figure 5A:
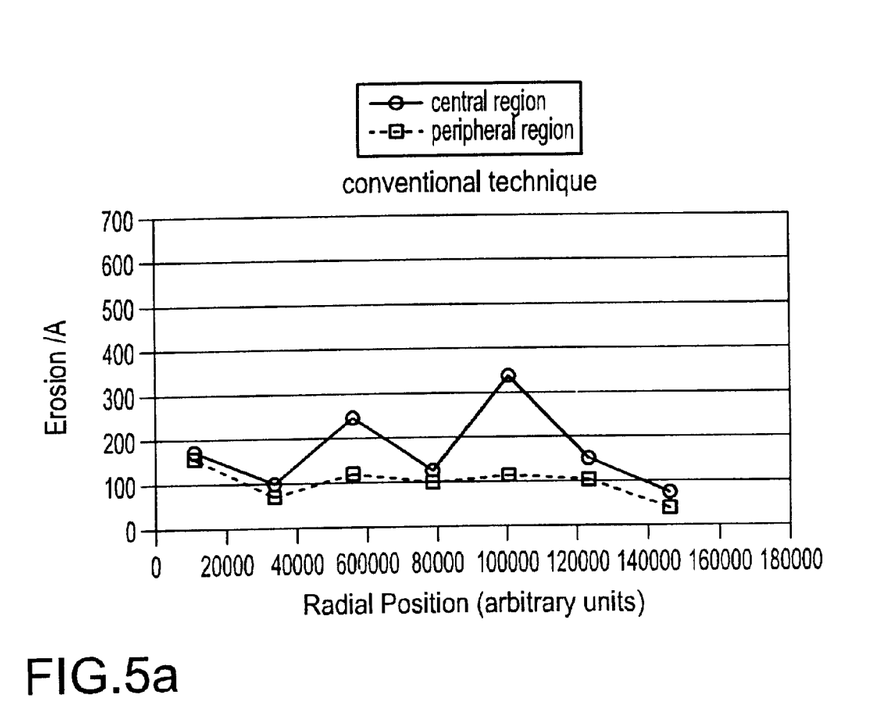
FIGS. 5*a*–5*e* are diagrams depicting measurement results of various metal layer profiles with respect to the obtained erosion in a subsequent CMP process.

In FIG. 5a, the erosion in the central region is significantly larger than the peripheral region, indicating that the removal rate in the central region exceeds the removal rate in the peripheral region. The CMP process was performed for 99 seconds and required an over-polish time of 18 seconds until the peripheral region was entirely cleared.

Figure 5B:
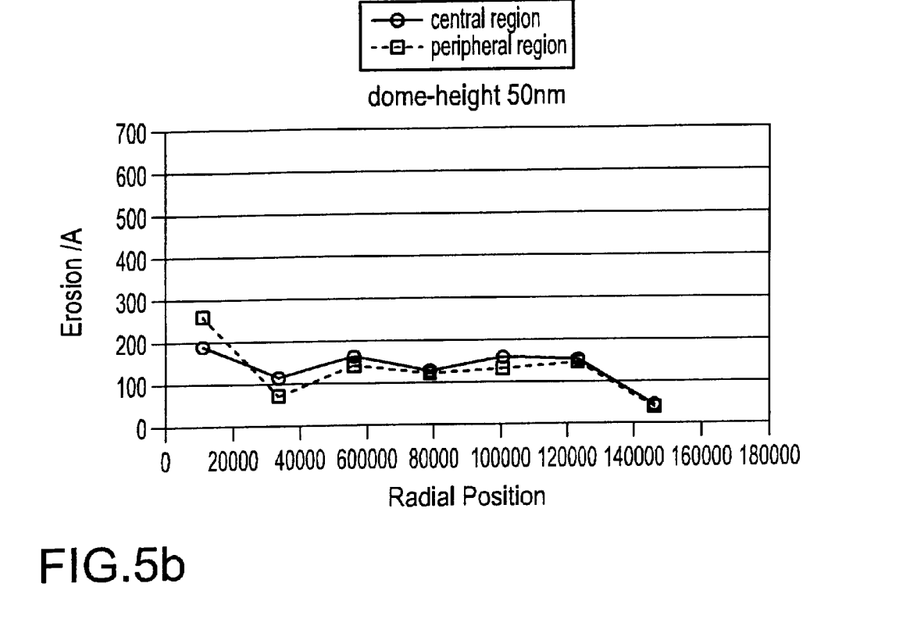

In FIG. 5b, representing the dome profile with 50 nm excess height, it is indicated that the removal rates in the central and peripheral regions are quite similar, since the erosion measured in the central region is only slightly larger than that measured in the peripheral region. The endpoint was detected in the central region at 109 seconds and an overpolish time of 18 seconds was added.

Figure 5C:
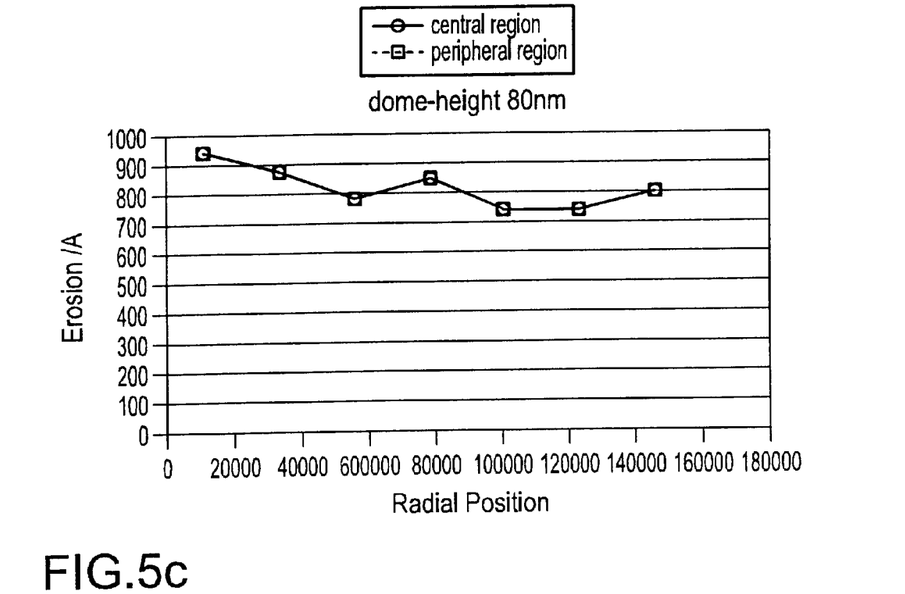

FIG. 5c shows the result for the dome-like structure with an excess height of 80 nm and indicates that the removal rates in the central and peripheral regions are substantially equal. Moreover, according to the endpoint detection, clearance in the peripheral and the central regions set in substantially simultaneously after 86 seconds and an overpolish time of 18 seconds was used.

Figure 5D:
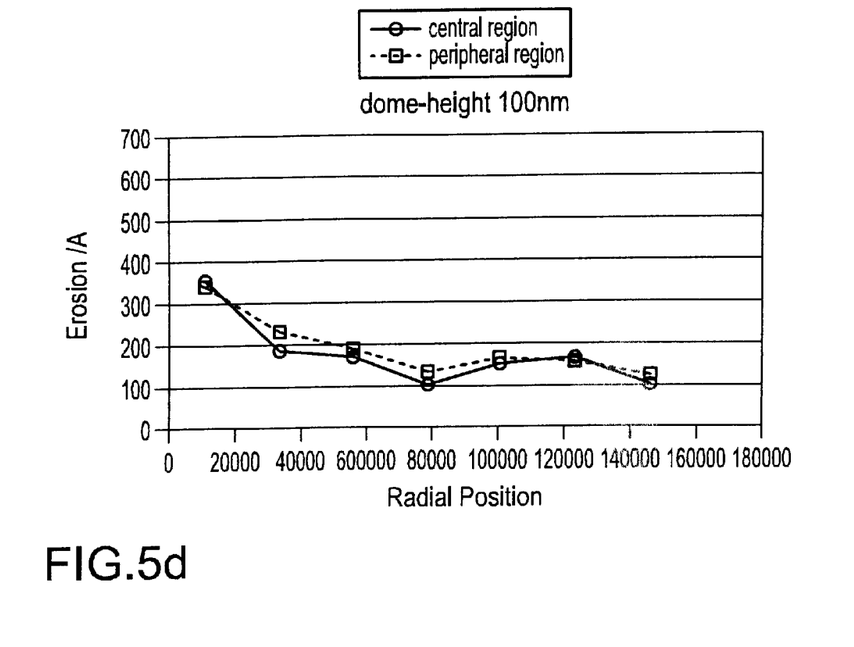

FIG. 5d shows the results for the dome-like structure with an excess height of 100 nm. The increased erosion of the peripheral region indicates that now the removal rate in the peripheral region is higher than in the central region. Moreover, a polish time of 111 seconds was necessary with an overpolish time of 18 seconds.

Figure 5E:
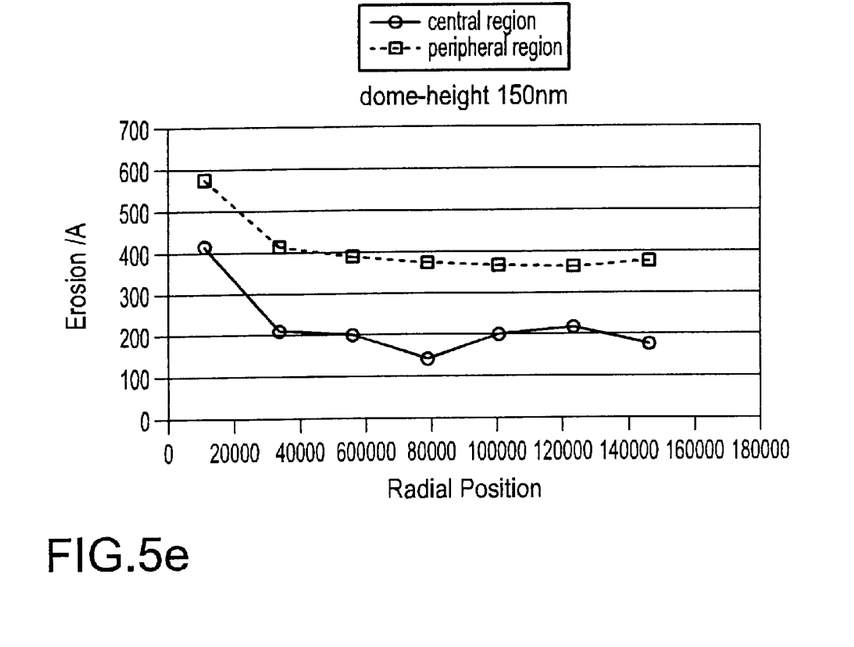

FIG. 5e clearly indicates that the removal rate in the peripheral region is now significantly larger than in the central region, since erosion at the peripheral region is dramatically increased.

From the above results, the dome-like profile with an excess height of 80 nm is selected and offers a minimum deviation of the erosion of the metal lines compared to the conventionally employed process (FIG. 5a) and additionally provides a reduced process time.

It should be noted that in the illustrative embodiments described so far, the substrates are divided into a first and a second region, however a more complex profile may be employed pursuant to process requirements. For instance, for current feature sizes and line densities, the above-established 80 nm dome height may be successfully implemented in the process, but other values for different lay-outs, feature sizes, metal/via layers and technologies may be required. Depending on future technologies a complete reverse shape (bowl shape) may be necessary. Furthermore, more complex or sophisticated polishing processes may require more complex profiles such as W-shapes or M-shapes and the like.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming metal lines, comprising:
    providing a substrate having formed therein a recessed portion in a first region and a second region;
    obtaining an estimated expected removal rate of the metal in the first region and the second region of the substrate during a chemical mechanical polishing to be subsequently performed;
    depositing the metal on the substrate by electroplating, wherein a deposition thickness of the metal in the first and second regions is adjusted in correspondence to the estimated expected removal rate in the first and second regions; and
    removing excess metal by chemical mechanical polishing to produce the metal line.

2. The method of claim 1, wherein obtaining an estimated expected removal rate includes performing an endpoint detection at the first and second regions of one or more previously processed substrates.

3. The method of claim 1, wherein obtaining an estimated expected removal rate includes determining at least one of dishing and erosion of the metal line in the first and second regions of a previously processed substrate.

4. The method of claim 1, wherein obtaining an estimated expected removal rate includes determining removal rate values from a model of the chemical mechanical polishing process.

5. The method of claim 4, wherein said model is represented by removal rate values for the first and second regions obtained by at least one of calculation on the basis of a parameter of the chemical mechanical polishing process and experiment.

6. The method of claim 1, wherein depositing the metal includes controlling at least one of the electrical field and electrolyte flow in the first and second regions during electroplating.

7. The method of claim 6, wherein an electrical field is controlled to be different in the first and second regions by providing a plurality of correspondingly located anode elements in the electroplating bath.

8. The method of claim 6, wherein an electrical field is controlled to be different in the first and second regions by providing a conductive shield between an anode and the substrate during electroplating.

9. The method of claim 6, wherein an electrical field is controlled to be different in the first and second regions by providing a non-conductive shield between an anode and the substrate during electroplating.

10. The method of claim 6, wherein a diffuser element having a diffusing pattern formed therein is provided between an anode and the substrate during electroplating.

11. The method of claim 6, wherein electrolyte flow to the second region is restricted during electroplating.

12. The method of claim 1, wherein the first region is a central region and the second region is a peripheral region.

13. The method of claim 1, wherein the metal is copper.

14. The method of claim 1, wherein the substrate comprises a third region, the third region exhibiting a removal rate during the chemical mechanical polishing that differs from that of the first and second regions and wherein a deposition thickness in the third region corresponds to the removal rate of the third region.

15. The method of claim 1, further comprising depositing a seed layer prior to depositing the metal layer, wherein an average thickness of the seed layer in the first region differs from that of the second region so that during electroplating a deposition rate in the first region differs from that of the second region.

16. The method of claim 15, wherein the seed layer is deposited by one of chemical vapor deposition and physical vapor deposition, whereby at least one of a shape of a plasma, a shape of a target material, a fluid flow to the substrate and a temperature distribution on the substrate is controlled to obtain a different seed layer thickness in the first and second regions.

17. A method of forming metal lines comprising:
    providing a substrate with a central region and a peripheral region, the central region and the peripheral region each having a recessed portion defining a height dimension;
    depositing a metal layer over the substrate, wherein an averaged layer thickness of the peripheral region is different from an averaged layer thickness of the central region; and
    removing excess metal from the substrate by chemical mechanical polishing, wherein the difference of the averaged layer thickness of the peripheral and the central regions is adjusted during the deposition of the metal such that the height of the metal in the recessed portions is within a predefined tolerance after the removal of the excess metal.

18. The method of claim 17 wherein adjusting the difference of the averaged layer thickness is carried out by obtaining, prior to depositing the metal layer, the height of the metal in the recessed portion in the central region and the peripheral region of a previously processed substrate.

19. The method of claim 17, wherein adjusting the difference of the averaged layer thickness is carried out on the basis of endpoint detection results of one or more previously processed substrates.

20. The method of claim 17, wherein adjusting the difference of the averaged layer thickness is carried out on the basis of measurement results of an immediately previously processed substrate to continuously update the controlling of the layer thickness in the first and second regions.

21. The method of claim 17, wherein the metal layer is deposited by electroplating and adjusting the difference of the averaged layer thickness includes controlling at least one of an electrical field and an electrolyte flow during the electroplating.

22. The method of claim 21, wherein the electrical field is controlled so as to be different in the central and peripheral regions by providing a plurality of correspondingly located anode elements in the electroplating bath.

23. The method of claim 21, wherein the electrical field is controlled so as to be different in the central and peripheral regions by providing a conductive shield between an anode and the substrate during electroplating.

24. The method of claim 21, wherein the electrical field is controlled so as to be different in the central and peripheral regions by providing a non-conductive shield between the anode and the substrate during electroplating.

25. The method of claim 21, wherein a diffuser element having a diffusing pattern formed therein is provided between an anode and the substrate during electroplating.

26. The method of claim 21, wherein the electrolyte flow to the peripheral region is restricted during electroplating.

27. The method of claim 17, further comprising depositing a seed layer prior to depositing the metal layer, wherein an averaged thickness of the seed layer in the central region differs from that of the peripheral region so that during electroplating a deposition rate of the central region differs from that of the peripheral region.

28. The method of claim 27, wherein the seed layer is deposited by one of chemical vapor deposition and physical vapor deposition, whereby at least one of shape of plasma, shape of target material, fluid flow to the substrate and temperature distribution on the substrate is controlled to obtain a different seed layer thickness in the central and peripheral regions.

29. The method of claim 17, wherein a maximum layer thickness in the central region exceeds a layer thickness at the perimeter of the substrate by approximately 50–120 nm.

30. The method of claim 17, wherein the substrate comprises a third region, the third region exhibiting an averaged removal rate during a chemical mechanical polishing that differs from that of the central and peripheral regions, and a deposition thickness in the third region that corresponds to the removal rate of the third region.

31. A method of forming metal lines in a first and a second region of a substrate, the method comprising:
    depositing a seed layer on the substrate;
    depositing a metal layer by electroplating while controlling at least one of an electrical field and electrolyte flow to the substrate so as to be different in the first and second regions to obtain a greater metal thickness in one of the first and second regions that is expected to have a higher removal rate in a subsequent chemical mechanical polishing step; and
    removing excess metal in the first and second regions by chemical mechanical polishing of the substrate.

32. The method of claim 31, further comprising obtaining at least one of an estimated removal rate and a parameter value indicative thereof for the first and second regions.

33. The method of claim 32, wherein obtaining at least one of an expected removal rate and a parameter value indicative thereof includes performing an endpoint detection at the first and second regions of one or more previously processed substrates.

34. The method of claim 32, wherein obtaining at least one of an expected removal rate and a parameter value indicative thereof includes determining at least one of dishing and erosion at the first and second regions of one or more previously processed substrates.

35. The method of claim 32, wherein obtaining at least one of an expected removal rate and a parameter value indicative thereof includes determining removal rate values and parameter values from a model of the chemical mechanical polishing process.

36. The method of claim 35, wherein said model is represented by removal rate values obtained by at least one of calculation, evaluation of process parameters of the chemical mechanical polishing process and experiment.

37. The method of claim 31, wherein controlling at least one of electrical fields and electrolyte flow includes controlling the electrical field so as to be different in the first and second regions by providing a plurality of correspondingly located anode elements in the electroplating bath.

38. The method of claim 31, wherein the electrical field is controlled so as to be different in the first and second regions by providing a conductive shield between an anode and the substrate during electroplating.

39. The method of claim 31, wherein the electrical field is controlled so as to be different in the first and second regions by providing a non-conductive shield between an anode and the substrate during electroplating.

40. The method of claim 31, wherein controlling at least one of electrical field and electrolyte flow is carried out by providing a diffuser element between an anode and a substrate during electroplating, wherein the diffuser element comprises a suitable diffusing pattern.

41. The method of claim 31, wherein the electrolyte flow to the second region is restricted during electroplating.

42. A method of forming a metal line in a first and a second region of the substrate, comprising:
    depositing a seed layer on the substrate while controlling an averaged seed layer thickness in the first region to be different from an averaged seed layer thickness in the second region;
    depositing a metal by electroplating to fill the metal lines, wherein a deposition rate during electroplating is different in the first and second regions in correspondence to the different averaged seed layer thicknesses; and
    removing excess metal from the substrate.

43. The method of claim 42, wherein depositing the seed layer is performed by sputter deposition.

44. The method of claim 43, wherein a collimator is provided between a target material and the substrate, the collimator supplying target atoms to the substrate differently in the first and second regions.

45. The method of claim 43, wherein at least one of a shape of a plasma, a radio frequency power, a feed gas supply and a substrate temperature is controlled to obtain a different averaged layer thickness in the first and second regions.

46. The method of claim 42, wherein the seed layer is deposited by chemical vapor deposition.

47. The method of claim 46, wherein a mask element is provided in the vicinity of the substrate to control the deposition rate of the seed layer in the first and second regions.

48. The method of claim 46, wherein at least one of feed gas supply, pressure and temperature of the substrate is controlled to obtain a different deposition rate in the first and second regions.

49. The method of claim 42, further comprising obtaining one of a removal rate and a parameter value indicative thereof for the first and second regions in a subsequent chemical mechanical polishing step prior to removing the excess metal.

50. The method of claim 49, wherein obtaining at least one of a removal rate and a parameter value indicative thereof includes performing an endpoint detection in the first and second regions of one or more previously processed substrates.

51. The method of claim 49, wherein obtaining at least one of a removal rate and a parameter value indicative thereof includes determining one of dishing and erosion in the first and second regions of one or more previously processed substrates.

52. The method of claim 49, wherein obtaining at least one of a removal rate and a parameter value indicative thereof includes determining corresponding values from a model of the chemical mechanical polishing process.

53. The method of claim 42, wherein the substrate comprises at least one third region, the third region exhibiting an average removal rate during chemical mechanical polishing that differs from that of the first and second regions, and an averaged seed layer thickness in the third region that corresponds to the removal rate of the third region.

54. A method of forming metal lines on a plurality of substrates, the method comprising:

obtaining parameter values indicative of a quality of a chemical mechanical polishing process to be performed for each of the substrates;

relating the parameter values for each substrate to a corresponding metal layer thickness profile;

depositing a metal layer on each substrate while controlling deposition parameters to substantially generate said metal thickness profile for each substrate; and removing excess metal from each of the substrates by chemical mechanical polishing.

55. The method of claim 54, wherein said parameter values are obtained from a model of the chemical mechanical polishing process of an individual substrate having a specified metal layer thickness profile.

56. The method of claim 55, wherein said specified metal layer thickness profile is varied until said model predicts the quality of the chemical mechanical polishing process to be within a predefined tolerance.

57. The method of claim 55, wherein said parameter values are obtained from a model of the chemical mechanical polishing process and a model of the deposition process.

* * * * *